United States Patent
Shiratake

(10) Patent No.: US 7,830,696 B2
(45) Date of Patent: Nov. 9, 2010

(54) FERROELECTRIC SEMICONDUCTOR STORAGE DEVICE

(75) Inventor: Shinichiro Shiratake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 346 days.

(21) Appl. No.: 12/027,038

(22) Filed: Feb. 6, 2008

(65) Prior Publication Data

US 2008/0186754 A1    Aug. 7, 2008

(30) Foreign Application Priority Data

Feb. 7, 2007   (JP) ............................... 2007-027576

(51) Int. Cl.
*G11C 11/22* (2006.01)
(52) U.S. Cl. ............... 365/145; 365/49.13; 365/65; 365/66; 365/102; 365/109; 365/117; 365/138; 365/149; 365/230.03
(58) Field of Classification Search ............. 365/49.13, 365/65, 66, 102, 109, 117, 138, 145, 149, 365/230.03
See application file for complete search history.

(56) References Cited

U.S. PATENT DOCUMENTS 7,099,178 B2 *   8/2006   Shiratake ................... 365/145
7,138,674 B2 *   11/2006  Shiga et al. ................ 257/295
7,646,623 B2 *   1/2010   Koide ......................... 365/145
2005/0122764 A1 *  6/2005  Takashima ................. 365/145
2006/0193162 A1 *  8/2006  Ogiwara et al. ............ 365/145

OTHER PUBLICATIONS

A 32-MB Chain FeAM with Segment/Stitch Array Architecture, Shiratake et al., Nov. 2003, IEEE Journal of Solid State Circuits, vol. 38, No. 11, all pages pertinent.*
U.S. Appl. No. 12/263,820, filed Nov. 3, 2008, Shiratake.

* cited by examiner

*Primary Examiner*—Hoai V Ho
*Assistant Examiner*—Fernando N Hidalgo
(74) *Attorney, Agent, or Firm*—Oblon, Spivak, McClelland, Maier & Neustadt, L.L.P.

(57) ABSTRACT

A ferroelectric semiconductor storage device includes: a block having a plurality of ferroelectric memory cells connected in series, each of the plurality of ferroelectric memory cells including a ferroelectric capacitor and a transistor connected in parallel to both ends of the ferroelectric capacitor; a word line connected to each of the transistors; a selection transistor connected to one end of the block; a bit line connected to the selection transistor; and a plate line connected to the other end of the block. The number of ferroelectric memory cells connected in each block in the ferroelectric semiconductor storage device is odd.

4 Claims, 14 Drawing Sheets

FIG. 8

| State | A0 | A1 | A2 | WL0 | WL1 | WL2 | WL3 | WL4 | WL5 | WL6 | WL7 | PL | BL(0) | BL(1) |
|---|---|---|---|---|---|---|---|---|---|---|---|---|---|---|
| Wait | — | — | — | H | H | H | H | H | H | H | H | L | L | L |
| Operation | L | L | L | L | H | H | H | H | H | H | H | H | H | L |
| Operation | H | L | L | H | L | H | H | H | H | H | H | H | H | L |
| Operation | L | H | L | H | H | L | H | H | H | H | H | H | H | L |
| Operation | H | H | L | H | H | H | L | H | H | H | H | H | L | H |
| Operation | L | L | H | H | H | H | H | L | H | H | H | H | L | H |
| Operation | H | L | H | H | H | H | H | H | L | H | H | H | L | H |
| Operation | L | H | H | H | H | H | H | H | H | L | H | H | L | H |
| Operation | H | H | H | H | H | H | H | H | H | H | L | H | L | H |

FERROELECTRIC SEMICONDUCTOR STORAGE DEVICE

CROSS REFERENCE TO RELATED APPLICATIONS

This application is based on and claims the benefit of priority from prior Japanese Patent Application No. 2007-27576, filed on Feb. 7, 2007, the entire contents of which are incorporated herein by reference.

BACKGROUND OF THE INVENTION

1. Field of the Invention

The present invention relates to a ferroelectric semiconductor storage device, and in particular, to a ferroelectric semiconductor storage device having a plurality of ferroelectric memory cells, each including a transistor connected to both ends of a ferroelectric capacitor.

2. Description of the Related Art

One semiconductor storage device is a ferroelectric memory referred to as a "TC-parallel-unit series connection type ferroelectric memory" (also referred to as a "chain-type FeRAM"), as described in Japanese Patent Laid-Open No. (HEI)10-255483. The chain-type FeRAM includes a plurality of ferroelectric memory cells, each including a ferroelectric capacitor and a transistor connected thereto.

When information is stored in such a ferroelectric memory cell, one block usually includes power-of-two numbers of memory cells, as digital information is represented by binary notation, and information is stored, erased, and so on, on the block-by-block basis. Thus, one block has power-of-two numbers of ferroelectric memory cells connected in series and ferroelectric memory cells in one block are continuously formed in both directions on a semiconductor substrate. As a plurality of blocks exist, each block is provided with a respective selection transistor for selecting a block. Thus, such a ferroelectric memory is formed by the power-of-two numbers of ferroelectric memory cells and a selection transistor as a unit.

SUMMARY OF THE INVENTION

A ferroelectric semiconductor storage device according to one aspect of the present invention comprises: a block having a plurality of ferroelectric memory cells connected in series, each of the plurality of ferroelectric memory cells including a ferroelectric capacitor and a transistor connected in parallel to both ends of the ferroelectric capacitor; a word line connected to each of the transistors; a selection transistor connected to one end of the block; a bit line connected to the selection transistor; and a plate line connected to the other end of the block, wherein the number of ferroelectric memory cells connected in the block is odd.

In addition, a ferroelectric semiconductor storage device according to another aspect of the present invention comprises: a first block having odd numbers of ferroelectric memory cells connected in series, each of the odd numbers of ferroelectric memory cells including a ferroelectric capacitor and a transistor connected in parallel to both ends of the ferroelectric capacitor; a second block having odd numbers of ferroelectric memory cells connected in series, each of the odd numbers of ferroelectric memory cells including a ferroelectric capacitor and a transistor connected in parallel to both ends of the ferroelectric capacitor; a plate line extending from a connection between one end of the first block and one end of the second block, each of the one ends connected to each other; a word line connected to each of the transistors; a first selection transistor connected to the other end of the first block; a second selection transistor connected to the other end of the second block; and a bit line connected to each of the first selection transistor and the second selection transistor.

In addition, a ferroelectric semiconductor storage device according to another aspect of the present invention comprises: a first block having odd numbers of ferroelectric memory cells connected in series, each of the odd numbers of ferroelectric memory cells including a ferroelectric capacitor and a transistor connected in parallel to both ends of the ferroelectric capacitor; a second block having odd numbers of ferroelectric memory cells connected in series, each of the odd numbers of ferroelectric memory cells including a ferroelectric capacitor and a transistor connected in parallel to both ends of the ferroelectric capacitor; a word line connected to each of the transistor of the first block and the transistor of the second block; a first selection transistor connected to one end of the first block; a second selection transistor connected to one end of the second block; a first bit line connected to the first selection transistor; a second bit line connected to the second selection transistor; a first plate line connected to the other end of the first block; and a second plate line connected to the other end of the second block.

BRIEF DESCRIPTION OF THE DRAWINGS

FIG. 8 illustrates states of input signals and output signals for the circuit diagram of FIG. 4;

DETAILED DESCRIPTION OF THE EMBODIMENTS

Background of the Invention

As described above, a ferroelectric memory is usually formed by a block, which includes even (power-of-two) numbers of ferroelectric memory cells, and a selection transistor as a unit. Both the ferroelectric memory cells and the selection transistor have respective transistors, which are formed on a semiconductor substrate such as a silicon substrate. These transistors, which are formed in a continuous manner in both directions on a semiconductor substrate such as a silicon substrate, are usually manufactured using a repeated pattern of two transistors in manufacturing process. Consequently, when power-of-two numbers of memory cells and one selection transistor are formed, the total number of transistors to be used is odd. Such odd numbers of transistors are not consistent with even numbers of patterns, which could disturb periodicity of patterns and usually hamper the reduction in ferroelectric memory size. In addition, such disturbance in periodicity of patterns would create variations in uniformity among ferroelectric memory cells. In particular, a ferroelectric memory cell adjacent to the corresponding selection transistor exhibits different properties than the other ferroelectric memory cells in the same block. This is derived from the results obtained from the inventors' experience and embodiments of the present invention are based on these results.

First Embodiment

A first embodiment of the present invention will now be described below. This embodiment relates to a configuration of a ferroelectric memory of a FeRAM.

Figure 1:
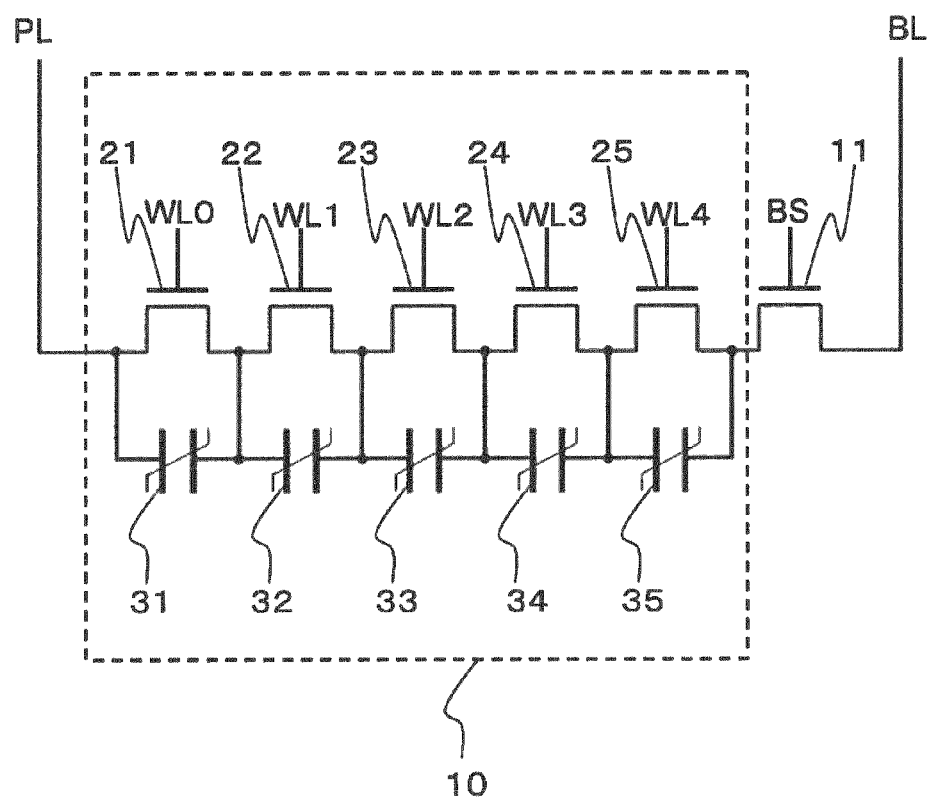
FIG. 1 is a circuit diagram according to a first embodiment.

FIG. 1 is a circuit diagram illustrating a configuration of one block of ferroelectric memory cells according to the first embodiment. In this embodiment, odd numbers of ferroelectric memory cells are included in one block, one end of which is connected to a selection transistor.

Specifically, a ferroelectric memory block 10 is formed by the following ferroelectric memory cells that are connected in series: a ferroelectric memory cell having a transistor 21 connected in parallel to both ends of a ferroelectric capacitor 31; a ferroelectric memory cell having a transistor 22 connected in parallel to both ends of a ferroelectric capacitor 32; a ferroelectric memory cell having a transistor 23 connected in parallel to both ends of a ferroelectric capacitor 33; a ferroelectric memory cell having a transistor 24 connected in parallel to both ends of a ferroelectric capacitor 34; and a ferroelectric memory cell having a transistor 25 connected in parallel to both ends of a ferroelectric capacitor 35 In addition, the gate of the transistor 21 is connected to a word line WL0, the gate of the transistor 22 connected to a word line WL1, the gate of the transistor 23 connected to a word line WL2, the gate of the transistor 24 connected to a word line WL3, and the gate of the transistor 25 connected to a word line WL4, respectively.

One end of the block 10, i.e., one of the ferroelectric memory cells that includes the ferroelectric capacitor 35 and the transistor 25 is connected via a selection transistor 11 to a bit line BL. In addition, the other end of the block 10, i.e., one of the ferroelectric memory cells that includes the ferroelectric capacitor 31 and the transistor 21 is connected to a plate line PL.

Figure 2:
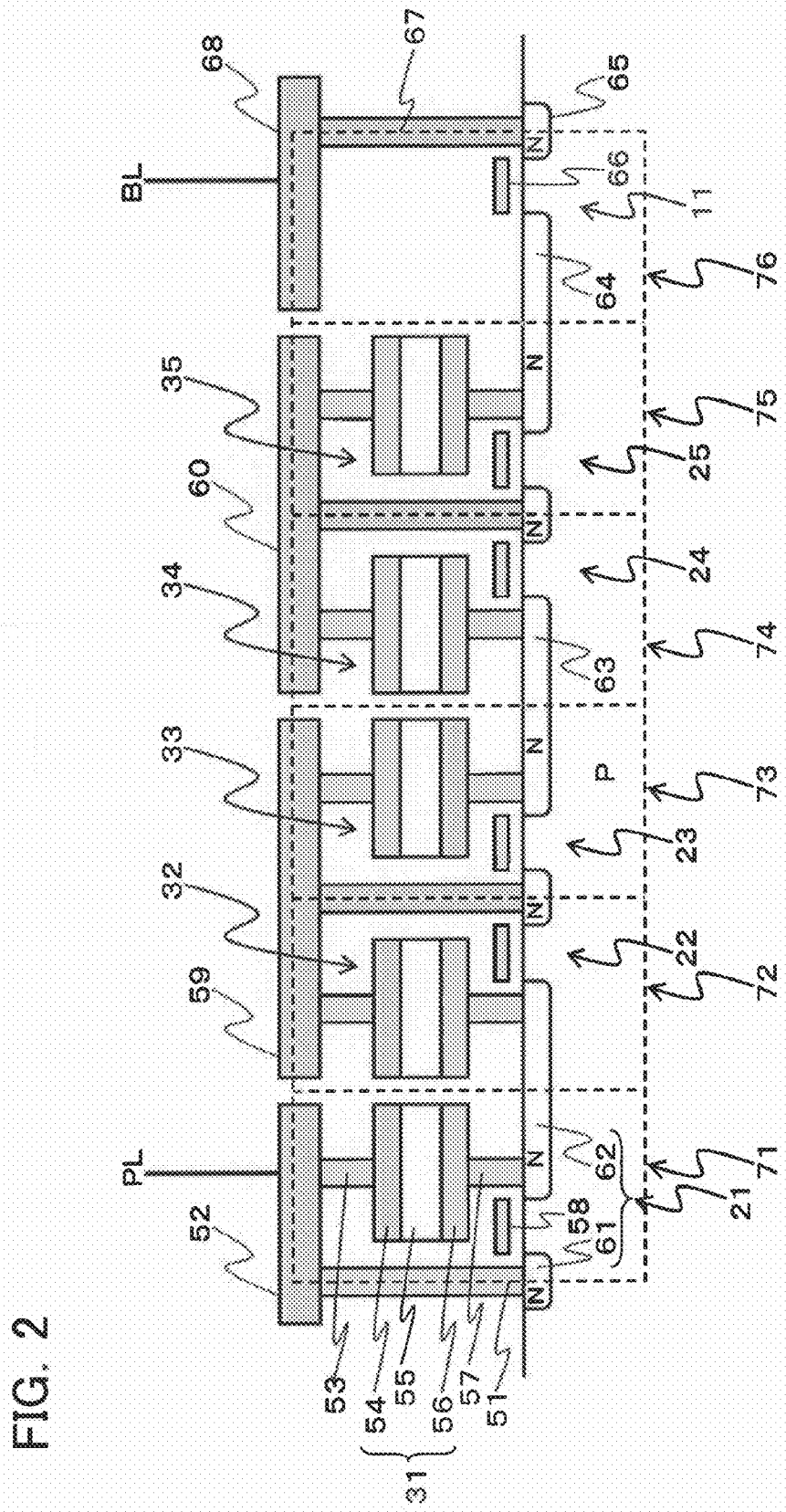
FIG. 2 is a structural cross-section diagram according to the first embodiment.

FIG. 2 is a structural cross-section diagram illustrating circuits of FIG. 1 formed on a silicon substrate according to the first embodiment. The ferroelectric memory according to this embodiment includes a plurality of ferroelectric memory cells and a selection transistor. Each of the plurality of ferroelectric memory cells has a respective electrode and a respective ferroelectric capacitor that are formed on a p-type silicon substrate in which an n-type impurity is diffused.

Specifically, a contact electrode 51 is formed on an n-type diffusion region 61 on a surface of the silicon substrate and connected to a metal wiring layer 52. The metal wiring layer 52 is connected to the plate line PL as well as to an upper electrode 54 of the ferroelectric capacitor 31 via a contact electrode 53. The ferroelectric capacitor 31 is formed by lamination of the upper electrode 54, a ferroelectric layer 55, and a lower electrode 56. The lower electrode 56 is connected via a contact electrode 57 to an n-type diffusion region 62 on the silicon substrate. A gate electrode 58 is formed immediately above the region between the n-type diffusion regions 61 and 62. Since the silicon substrate is of p-type, the n-type diffusion regions 61 and 62 together with the gate electrode 58 form the transistor 21. A ferroelectric memory cell 71, which includes a region surrounded by dashed lines, is formed by the transistor 21 and the ferroelectric capacitor 31 connected to both ends thereof. The other ferroelectric memory cells are arranged in a similar configuration. The adjacent ferroelectric memory cells are symmetrically formed on a corresponding boundary surface. That is, a ferroelectric memory cell 72 adjacent to the ferroelectric memory cell 71 includes the transistor 22 and the ferroelectric capacitor 32 that are connected in parallel via corresponding contact electrodes. The ferroelectric memory cell 71 and the ferroelectric memory cell 72 are symmetrically formed on the boundary surface therebetween. The ferroelectric memory according to this embodiment is formed by a repeated pattern of the ferroelectric memory cell 71 and the ferroelectric memory cell 72. Besides, the ferroelectric memory cell 71 and the ferroelectric memory cell 72 are connected via the n-type diffusion layer 62.

A ferroelectric memory cell 73 adjacent to the ferroelectric memory cell 72 includes the transistor 23 and the ferroelectric capacitor 33. The transistor 23 and the ferroelectric capacitor 33 are connected in parallel via corresponding contact electrodes. In addition, the ferroelectric memory cell 73 is connected via a metal wiring layer 59 to the ferroelectric memory cell 72.

A ferroelectric memory cell 74 adjacent to the ferroelectric memory cell 73 includes the transistor 24 and the ferroelectric capacitor 34. The transistor 24 and the ferroelectric capacitor 34 are connected in parallel via corresponding contact electrodes. In addition, the ferroelectric memory cell 74 is connected via an n-type diffusion layer 63 to the ferroelectric memory cell 73.

A ferroelectric memory cell 75 adjacent to the ferroelectric memory cell 74 includes the transistor 25 and the ferroelectric capacitor 35. The transistor 25 and the ferroelectric capacitor 35 are connected in parallel via corresponding contact electrodes. In addition, the ferroelectric memory cell 75 is connected via a metal wiring layer 60 to the ferroelectric memory cell 74.

As can be seen from the above, five ferroelectric memory cells 71, 72, 73, 74, 75 are connected in series to configure one block. In one end of the block, i.e., a region 76 adjacent to the ferroelectric memory cell 75, n-type diffusion regions 64 and 65 together with a gate electrode 66 form the selection transistor 11. The n-type diffusion region 65 is connected via a contact electrode 67 to a metal wiring layer 68. Further, the metal wiring layer 68 is connected to the bit line BL.

With the configuration of this embodiment, six transistors are formed on the silicon substrate: five transistors 21, 22, 23, 24 and 25 that configure five ferroelectric memory cells 71, 72, 73, 74 and 75, and the selection transistor 11. Therefore, the ferroelectric memory may be formed without disturbing any above-mentioned periodic pattern of the two transistors. As a result, uniform properties may be obtained for each ferroelectric memory cell. In particular, improved uniformity of property may be obtained among the ferroelectric memory cell 75 adjacent to the selection transistor 11 and the other ferroelectric memory cells 71, 72, 73 and 74.

Figure 3:
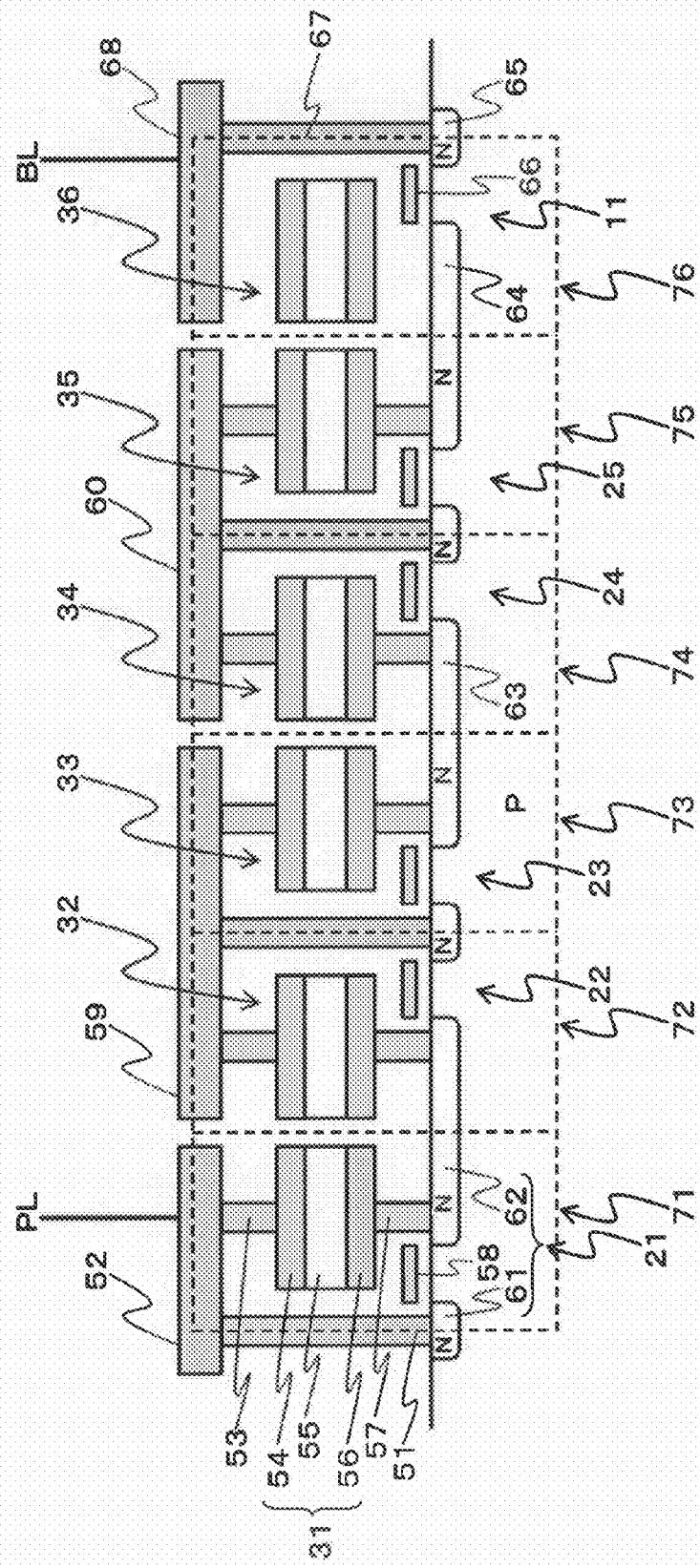
FIG. 3 is another structural cross-section diagram according to the first embodiment.

Further, in this embodiment, a dummy ferroelectric capacitor may be provided to obtain even more uniform properties for each ferroelectric memory cell. Specifically, as illustrated in FIG. 3, a dummy ferroelectric capacitor 36 is formed at a position within the region 76. The region 76 is for forming the selection transistor 11, and is adjacent to the ferroelectric memory cell 75. The position where the dummy ferroelectric capacitor 36 is formed corresponds to a position where the ferroelectric capacitor 35 is formed in the adjacent ferroelectric memory cell 75. As a result, further improved symmetry features may be obtained between the ferroelectric memory cell 75 and the region 76 where the selection transistor 11 is formed. That is, the ferroelectric capacitors 35 and 36 and their vicinity of contact electrodes are symmetrically formed at a position where a corresponding capacitor electrode is formed, with respect to the boundary between the ferroelectric memory cells 75 and 76. On the other hand, for example, focusing on the ferroelectric memory cells 73 and 74, a corresponding capacitor and a corresponding electrode are symmetrically formed with respect to the boundary between these ferroelectric memory cells. Therefore, further improved uniformity of property may be obtained among the ferroelectric memory cell 75 and the other ferroelectric memory cells 71, 72, 73, 74. Besides, the dummy ferroelectric capacitor 36 is provided for ensuring uniformity and periodicity, and so it is not connected to the n-type diffusion region 64 or the metal wiring layer 68.

Second Embodiment

A second embodiment of the present invention will now be described below. This embodiment relates to a configuration of a ferroelectric memory of a FeRAM.

Figure 4:
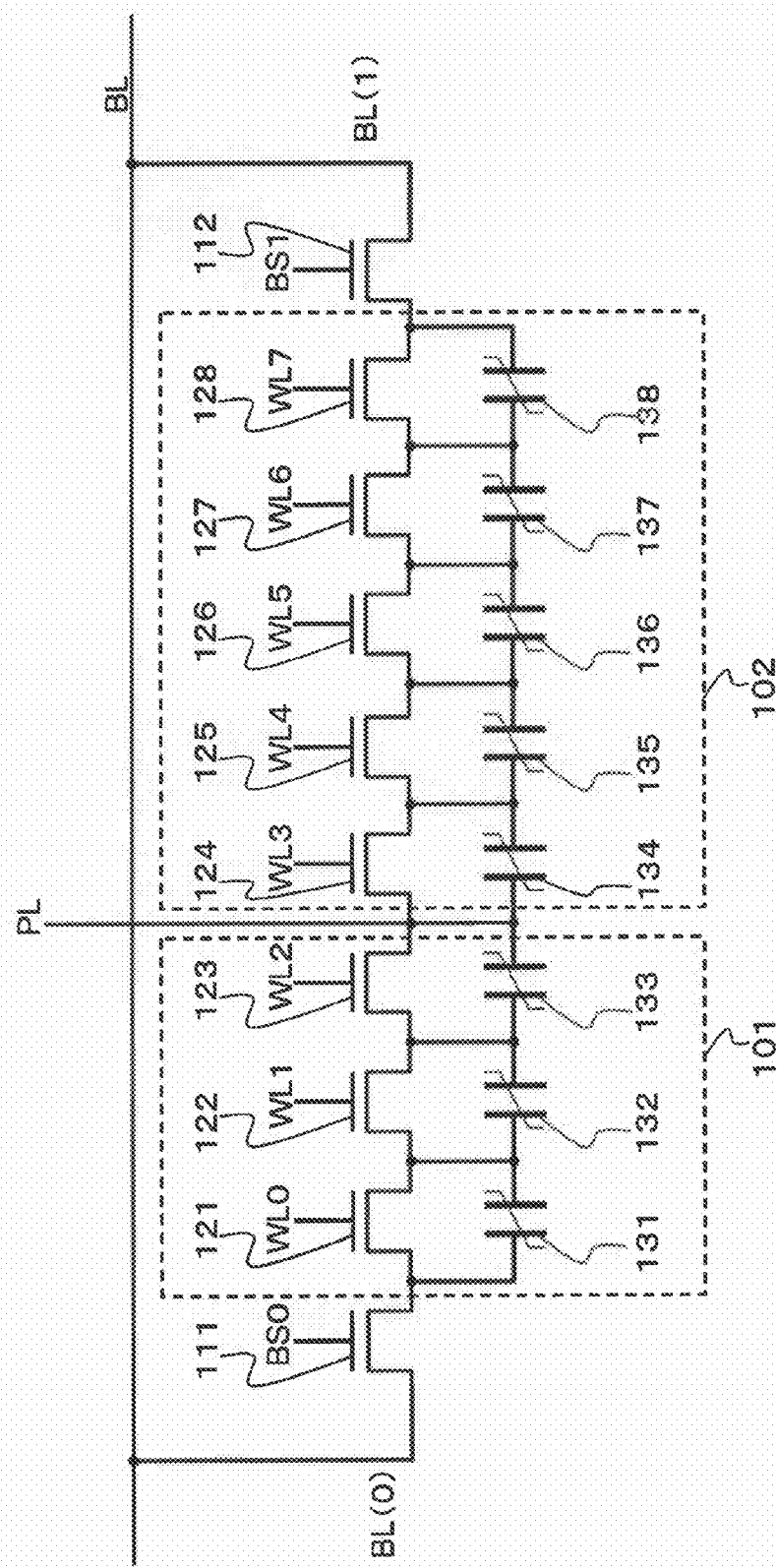
FIG. 4 is a circuit diagram according to a second embodiment.

FIG. 4 is a circuit diagram illustrating a configuration of one block in the ferroelectric memory according to the second embodiment. This embodiment comprises one ferroelectric memory block having a first block and a second block connected in series. Each of the first and second blocks has odd numbers of ferroelectric memory cells connected in series, respectively. Thus, the one ferroelectric memory block includes even numbers of ferroelectric memory cells.

Specifically, a first block 101 is formed by the following ferroelectric memory cells that are connected in series: a ferroelectric memory cell having a transistor 121 connected to both ends of a ferroelectric capacitor 131; a ferroelectric memory cell having a transistor 122 connected to both ends of a ferroelectric capacitor 132; and a ferroelectric memory cell having a transistor 123 connected to both ends of a ferroelectric capacitor 133. The gate of the transistor 121 is connected to a word line WL0, the gate of the transistor 122 connected to a word line WL1, and the gate of the transistor 123 connected to a word line WL2, respectively.

In addition, a second block 102 is formed by the following ferroelectric memory cells that are connected in series: a ferroelectric memory cell having a transistor 124 connected to both ends of a ferroelectric capacitor 134; a ferroelectric memory cell having a transistor 125 connected to both ends of a ferroelectric capacitor 135; a ferroelectric memory cell having a transistor 126 connected to both ends of a ferroelectric capacitor 136; a ferroelectric memory cell having a transistor 127 connected to both ends of a ferroelectric capacitor 137; and a ferroelectric memory cell having a transistor 128 connected to both ends of a ferroelectric capacitor 138. The gate of the transistor 124 is connected to a word line WL3, the gate of the transistor 125 connected to a word line WL4, the gate of the transistor 126 connected to a word line WL5, the gate of the transistor 127 connected to a word line WL6, and the gate of the transistor 128 connected to a word line WL7, respectively.

One end of the first block 101, i.e., one of the ferroelectric memory cells that includes the ferroelectric capacitor 133 and the transistor 123 is connected to one end of the second block 102, i.e., one of the ferroelectric memory cells that includes the ferroelectric capacitor 134 and the transistor 124. The first and second blocks 101 and 102 entirely form one ferroelectric memory block.

The first block 101 includes three ferroelectric memory cells, while the second block 102 includes five ferroelectric memory cells. Therefore, the number of ferroelectric memory cells in the one ferroelectric memory block including the first and second blocks 101 and 102 is eight (even number), which is a power-of-two natural number. The one ferroelectric memory block includes, the power-of-two natural numbers of, eight (even numbers of), ferroelectric memory cells. In addition, a plate line PL is formed so as to extend from the connection between one end of the first block 101 and one end of the second block 102.

The other end of the first block 101, i.e., one of the ferroelectric memory cells that includes the ferroelectric capacitor 131 and the transistor 121 is connected via a selection transistor 111 to a bit line BL (BL(0)). In addition, the other end of the second block 102, i.e., one of ferroelectric memory cells that includes the ferroelectric capacitor 138 and the transistor 128 is connected via a selection transistor 112 to a bit line BL (BL(1)). Besides, the gate of the selection transistor 111 is connected to a block selection line BS0, while the gate of the selection transistor 112 is connected to a block selection line BS1.

Figure 5:
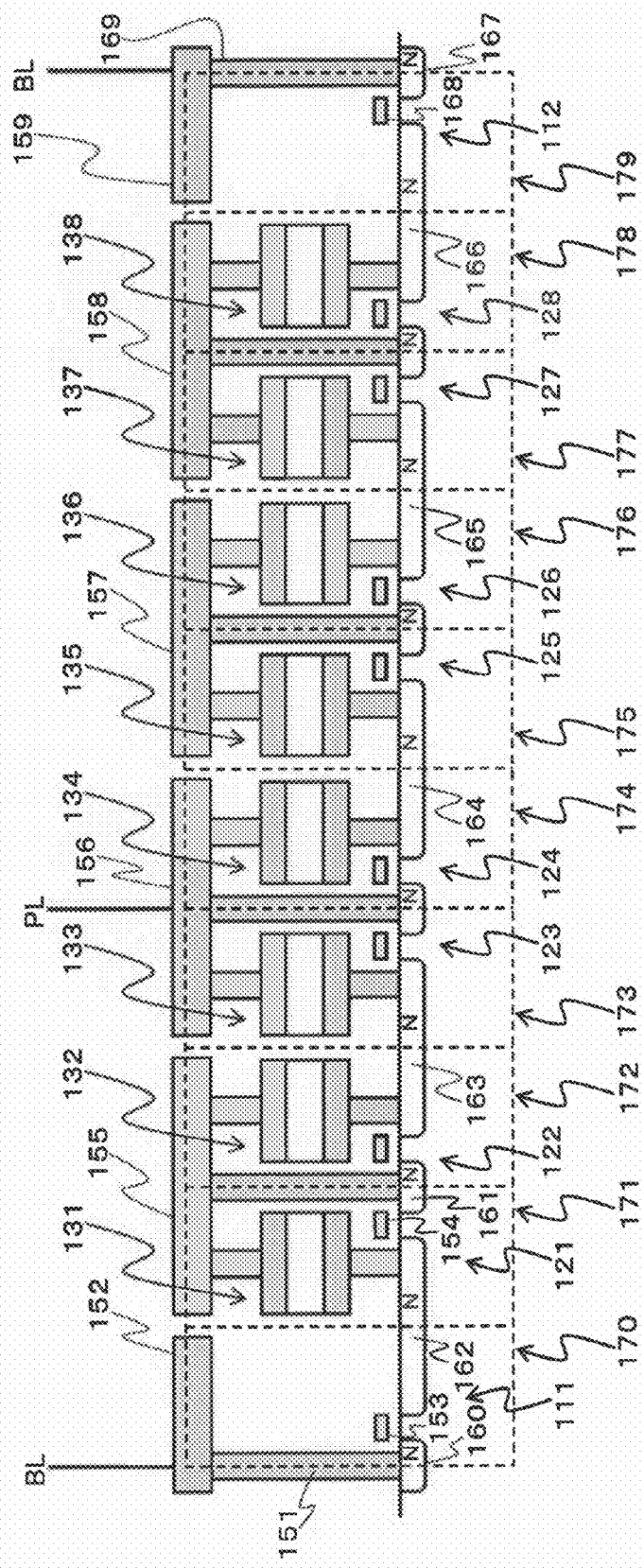
FIG. 5 is a structural cross-section diagram according to the second embodiment.

FIG. 5 is a structural cross-section diagram illustrating circuits illustrated in FIG. 4 formed on a silicon substrate according to the second embodiment.

The ferroelectric memory according to this embodiment includes a plurality of ferroelectric memory cells and a selection transistor. Each of the plurality of ferroelectric memory cells has a respective electrode and a respective ferroelectric capacitor that are formed on a p-type silicon substrate in which an n-type impurity is diffused. Specifically, a contact electrode 151 is formed on an n-type diffusion region 160 on a surface of the silicon substrate and connected via a metal wiring layer 152 to the bit line BL.

A gate electrode 153 is formed immediately above the region between the n-type diffusion region 160 and an n-type diffusion region 162 on the silicon substrate. Since the silicon substrate is of p-type, the n-type diffusion layers 160 and 162 together with the gate electrode 153 form the selection transistor 111. A region 170 (surrounded by dashed lines) where the selection transistor 111 is formed is substantially as large as a region that configures one ferroelectric memory cell described hereinafter.

A ferroelectric memory cell 171 surrounded by dashed lines is formed adjacent to the region 170 where the selection transistor 111 is formed. The ferroelectric memory cell 171 includes: the transistor 121 including n-type diffusion layers 161 and 162 and a gate electrode 154; and the ferroelectric capacitor 131 connected in parallel to both ends of the transistor 121. The ferroelectric memory cell 171 is connected via the n-type diffusion region 162 to the selection transistor 111. Besides, each ferroelectric memory cell has a similar configuration to the first embodiment.

A ferroelectric memory cell 172 adjacent to the ferroelectric memory cell 171 includes the transistor 122 and the ferroelectric capacitor 132. The transistor 122 and the ferroelectric capacitor 132 are connected in parallel via corresponding contact electrodes. In addition, the ferroelectric memory cell 171 and the ferroelectric memory cell 172 are connected via a metal wiring layer 155.

A ferroelectric memory cell 173 adjacent to the ferroelectric memory cell 172 includes the transistor 123 and the ferroelectric capacitor 133. The transistor 123 and the ferroelectric capacitor 133 are connected in parallel via corresponding contact electrodes. In addition, the ferroelectric memory cell 172 and the ferroelectric memory cell 173 are connected via an n-type diffusion layer 163.

The ferroelectric memory according to this embodiment is formed by a repeated pattern of the ferroelectric memory cell 171 and the ferroelectric memory cell 172.

Besides, the ferroelectric memory cell 171, 172 and 173 entirely form the first block 101 illustrated in FIG. 4, and the ferroelectric capacitor 133 in the ferroelectric memory cell 173 is connected via corresponding contact electrodes to a metal wiring layer 156. The metal wiring layer 156 is connected to the plate line PL.

A ferroelectric memory cell 174 adjacent to the ferroelectric memory cell 173 includes the transistor 124 and the ferroelectric capacitor 134. The transistor 124 and the ferroelectric capacitor 134 are connected in parallel via corresponding contact electrodes. In addition, the ferroelectric memory cell 173 and the ferroelectric memory cell 174 are connected via the metal wiring layer 156.

A ferroelectric memory cell 175 adjacent to the ferroelectric memory cell 174 includes the transistor 125 and the ferroelectric capacitor 135. The transistor 125 and the ferroelectric capacitor 135 are connected in parallel via corresponding contact electrodes. In addition, the ferroelectric memory cell 174 and the ferroelectric memory cell 175 are connected via an n-type diffusion layer 164.

A ferroelectric memory cell 176 adjacent to the ferroelectric memory cell 175 includes the transistor 126 and the ferroelectric capacitor 136. The transistor 126 and the ferroelectric capacitor 136 are connected in parallel via corresponding contact electrodes. In addition, the ferroelectric memory cell 175 and the ferroelectric memory cell 176 are connected via a metal wiring layer 157.

A ferroelectric memory cell 177 adjacent to the ferroelectric memory cell 176 includes the transistor 127 and the ferroelectric capacitor 137. The transistor 127 and the ferroelectric capacitor 137 are connected in parallel via corresponding contact electrodes. In addition, the ferroelectric memory cell 176 and the ferroelectric memory cell 177 are connected via an n-type diffusion layer 165.

A ferroelectric memory cell 178 adjacent to the ferroelectric memory cell 177 includes the transistor 128 and the ferroelectric capacitor 138. The transistor 128 and the ferroelectric capacitor 138 are connected in parallel via corresponding contact electrodes. In addition, the ferroelectric memory cell 177 and the ferroelectric memory cell 178 are connected via a metal wiring layer 158.

Besides, the ferroelectric memory cell 174, 175, 176, 177 and 178 entirely form the second block 102 illustrated in FIG. 4.

The selection transistor 112 is formed in a region 179 surrounded by dashed lines adjacent to the ferroelectric memory cell 178. Specifically, a gate electrode 168 is formed immediately above the region between an n-type diffusion layer 166 and an n-type diffusion layer 167 on the silicon substrate. Since the silicon substrate is a p-type substrate, the n-type diffusion layers 166 and 167 together with the gate electrode 168 form the selection transistor 112. A region 179 (surrounded by dashed lines) where the selection transistor 112 is formed is substantially as large as the region that configures the one ferroelectric memory cell mentioned above.

A contact electrode 169 is formed on the n-type diffusion layer 167 and connected to a metal wiring layer 159. The metal wiring layer 159 is connected to the bit line BL.

Since one block is configured by a first block that includes odd numbers of, three, ferroelectric memory cells and a second block that also includes odd numbers of, five, ferroelectric memory cells, even numbers of, eight, ferroelectric memory cells and two selection transistors are formed accordingly. These two selection transistors have substantially the same structures for their patterns as those of the ferroelectric memory cells, except that, unlike the ferroelectric memory cells, no ferroelectric capacitor shall be formed therein. Therefore, the ferroelectric memory may be formed without disturbing any periodic pattern of the ferroelectric memory cells.

Figure 6:
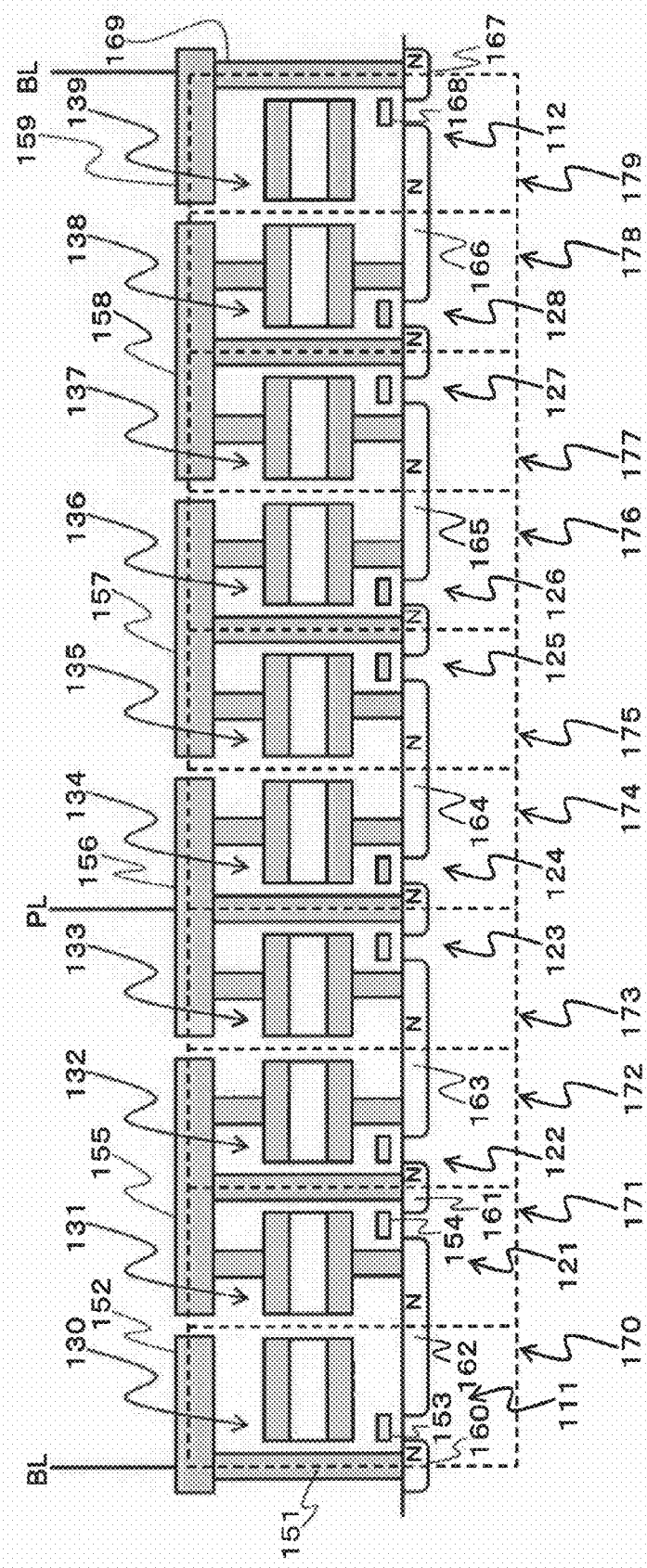
FIG. 6 is another structural cross-section diagram according to the second embodiment.

Further, in this embodiment, a dummy ferroelectric capacitor may be provided to obtain even more uniform properties for each ferroelectric memory cell. Specifically, as illustrated in FIG. 6, a dummy ferroelectric capacitor 130 is formed at a position within the region 170. The region 170 is for forming the selection transistor 111, and is adjacent to the ferroelectric memory cell 171. The position where the dummy ferroelectric capacitor 130 is formed corresponds to a position where the ferroelectric capacitor 131 is formed in the adjacent ferroelectric memory cell 171. And together with this, a dummy ferroelectric capacitor 139 is formed at a position within the region 179. The region 179 is for forming the selection transistor 112, and is adjacent to the ferroelectric memory cell 178. The position where the dummy ferroelectric capacitor 139 is formed corresponds to a position where the ferroelectric capacitor 138 is formed in the adjacent ferroelectric memory cell 178. As a result, further improved symmetry features may be obtained between the ferroelectric memory cell 171 and the region 170 where the selection transistor 111 is formed, as well as between the ferroelectric memory cell 178 and the region 179 where the selection transistor 112 is formed. Therefore, even more uniform properties may be obtained among the ferroelectric memory cells 171 and 178 and the other ferroelectric memory cells 172, 173, 174, 175, 176, 177. Besides, the dummy ferroelectric capacitors 130 and 139 are provided for ensuring uniformity and periodicity, and so they are not connected to any of the n-type diffusion layers or the metal wiring layers.

Figure 7:
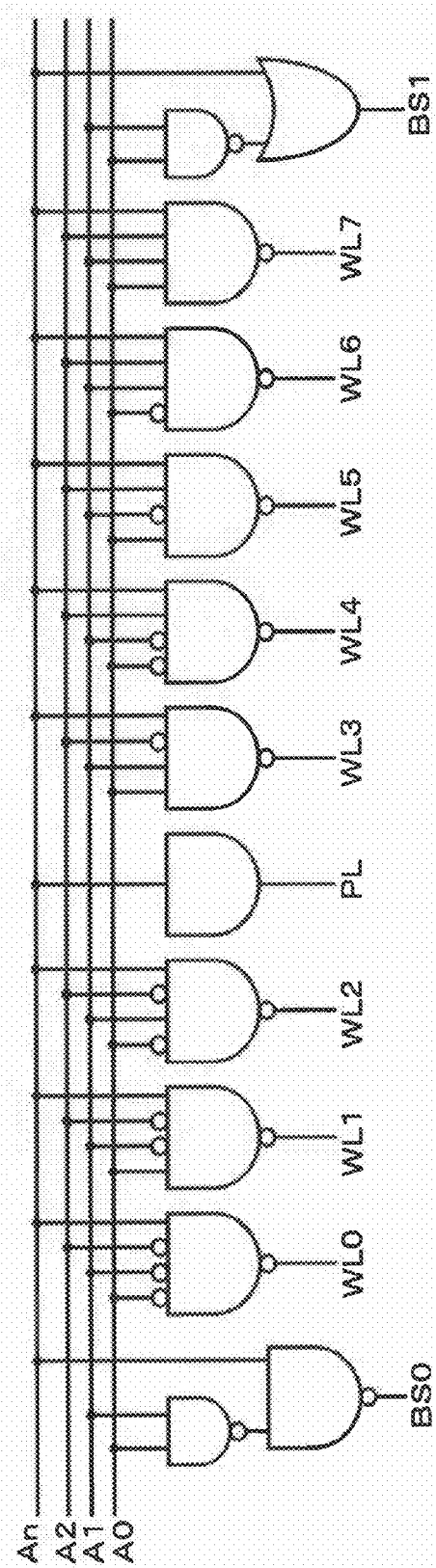
FIG. 7 is a diagram of logic circuits for driving respective circuits according to the second embodiment.

Based on FIGS. 7 and 8, operations of the ferroelectric memory according to this embodiment will now be described below. Each circuit of FIG. 7 is a control circuit in the circuit illustrated in FIG. 4. Specifically, each output of the circuit illustrated in FIG. 7 is connected to the block selection lines BS0 and BS1, the plate line PL, the word lines WL0, WL1, WL2, WL3, WL4, WL5, WL6, WL7 in the circuit illustrated in FIG. 4. Controlling input signals "A0", "A1", "A2" of the circuit illustrated in FIG. 7 enables selection of a certain ferroelectric memory cell. Besides, if the capacity per block is not less than 8 bits, an additional input signal "An" may be added to achieve such controls. FIG. 8 illustrates a relationship between the input signals "A0", "A1", "A2", the word lines WL0, WL1, WL2, WL3, WL4, WL5, WL6, WL7, the plate line PL, and the bit line BL. Besides, although BL(0) represents one end of the bit line directly connected to the selection transistor 111 and BL(1) represents the other end of the bit line directly connected to the selection transistor 112, BL(0) and BL(1) are here connected as the bit line BL.

Third Embodiment

A third embodiment of the present invention will now be described below.

Figure 9:
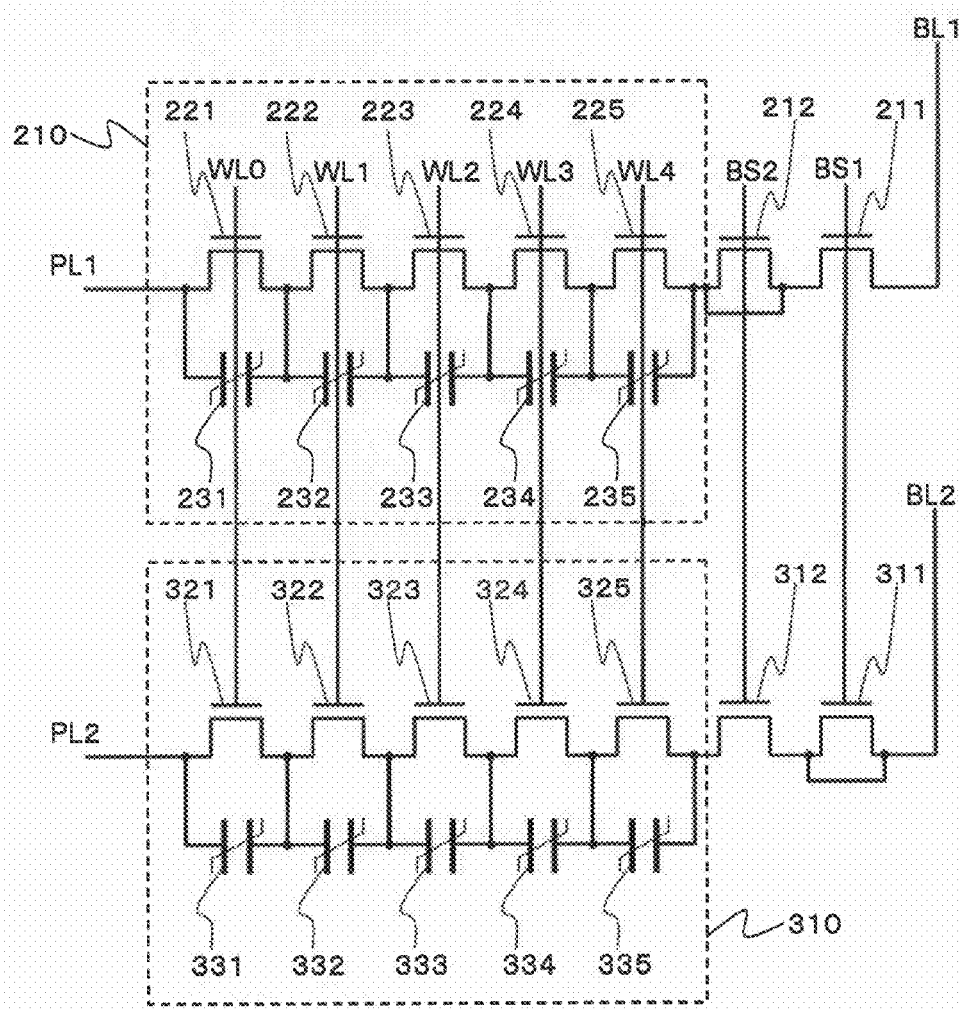
FIG. 9 is a circuit diagram according to a third embodiment.

FIG. 9 is a circuit diagram illustrating a configuration of ferroelectric memory cells according to the third embodiment. This embodiment combines two blocks, each of which includes odd numbers of ferroelectric memory cells, wherein a respective selection transistor is connected to one end of each block.

Specifically, the ferroelectric memory according to this embodiment includes two ferroelectric memory blocks 210 and 310. The ferroelectric memory block 210 has the following ferroelectric memory cells that are connected in series: a ferroelectric memory cell having a transistor 221 connected in parallel to both ends of a ferroelectric capacitor 231; a ferroelectric memory cell having a transistor 222 connected in parallel to both ends of a ferroelectric capacitor 232; a ferroelectric memory cell having a transistor 223 connected in parallel to both ends of a ferroelectric capacitor 233; a ferroelectric memory cell having a transistor 224 connected in parallel to both ends of a ferroelectric capacitor 234; and a ferroelectric memory cell having a transistor 225 connected in parallel to both ends of a ferroelectric capacitor 235. In addition, the gate of the transistor 221 is connected to a word line WL0, the gate of the transistor 222 connected to a word line WL1, the gate of the transistor 223 connected to a word line WL2, the gate of the transistor 224 connected to a word line WL3, and the gate of the transistor 225 connected to a word line WL4, respectively.

One end of the block 210, i.e., one of the ferroelectric memory cells that includes the ferroelectric capacitor 235 and the transistor 225 is connected via a shortened transistor 212 to a selection transistor 211, which is in turn connected to a bit line BL1. In addition, the other end of the block 210, i.e., one of the ferroelectric memory cells that includes the ferroelectric capacitor 231 and the transistor 221 is connected to a plate line PL1.

On the other hand, a ferroelectric memory block 310 has the following ferroelectric memory cells that are connected in series: a ferroelectric memory cell having a transistor 321 connected in parallel to both ends of a ferroelectric capacitor 331; a ferroelectric memory cell having a transistor 322 connected in parallel to both ends of a ferroelectric capacitor 332; a ferroelectric memory cell having a transistor 323 connected in parallel to both ends of a ferroelectric capacitor 333; a ferroelectric memory cell having a transistor 324 connected in parallel to both ends of a ferroelectric capacitor 334; a ferroelectric memory cell having a transistor 325 connected in parallel to both ends of a ferroelectric capacitor 335. In addition, the gate of the transistor 321 is connected to a word line WL0, the gate of the transistor 322 connected to a word line WL1, the gate of the transistor 323 connected to a word line WL2, the gate of the transistor 324 connected to a word line WL3, and the gate of the transistor 325 connected to a word line WL4, respectively.

One end of the block 310, i.e., one of the ferroelectric memory cells that includes the ferroelectric capacitor 335 and the transistor 325 is connected to a selection transistor 312 and a bit line BL2 via a shortened transistor 311. In addition, the other end of the block 310, i.e., one of the ferroelectric memory cells that includes the ferroelectric capacitor 331 and the transistor 321 is connected to a plate line PL2.

Figure 10:
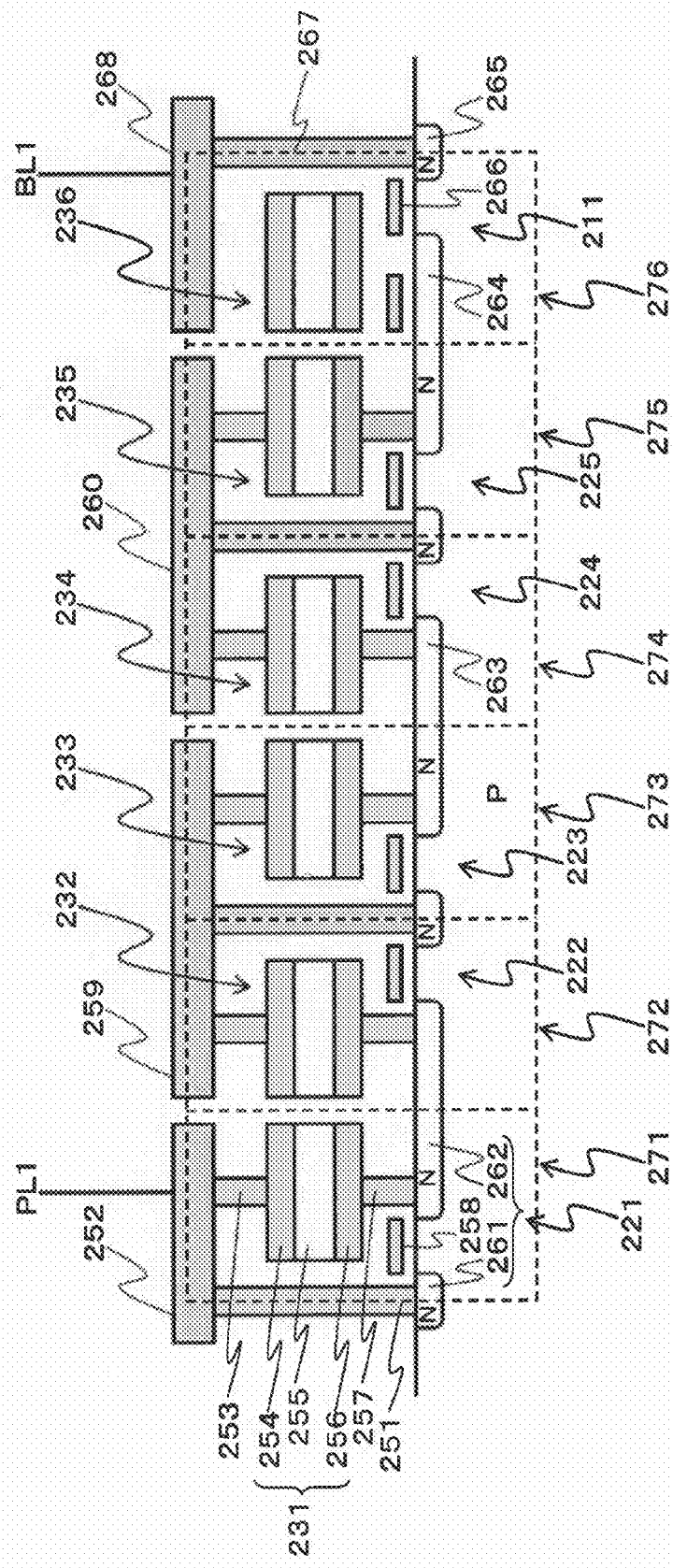
FIG. 10 is a structural cross-section diagram (1) according to the third embodiment.

FIG. 10 is a structural cross-section diagram illustrating circuits in the block 210 of FIG. 9 formed on a silicon substrate according to the third embodiment.

Specifically, the ferroelectric memory according to this embodiment includes a plurality of ferroelectric memory cells and a selection transistor. Each of the plurality of ferroelectric memory cells has a respective electrode and a respective ferroelectric capacitor that are formed on a p-type silicon substrate in which an n-type impurity is diffused. That is, a contact electrode 251 is formed on an n-type diffusion region 261 on a surface of the silicon substrate and connected to a metal wiring layer 252. The metal wiring layer 252 is connected to the plate line PL1 as well as to an upper electrode 254 of the ferroelectric capacitor 231 via a contact electrode 253. The ferroelectric capacitor 231 is formed by lamination of the upper electrode 254, a ferroelectric layer 255, and a lower electrode 256. The lower electrode 256 is connected via a contact electrode 257 to an n-type diffusion region 262 on the silicon substrate. A gate electrode 258 is formed immediately above the region between the n-type diffusion region 261 and the n-type diffusion region 262. Since the silicon substrate is of p-type, the n-type diffusion regions 261 and 262 together with the gate electrode 258 form the transistor 221. A ferroelectric memory cell 271, which includes a region surrounded by dashed lines, is formed by the transistor 221 and the ferroelectric capacitor 231 connected to both ends thereof. The other ferroelectric memory cells are arranged in a similar configuration. The adjacent ferroelectric memory cells are symmetrically formed on a corresponding boundary surface. That is, a ferroelectric memory cell 272 adjacent to the ferroelectric memory cell 271 includes the transistor 222 and the ferroelectric capacitor 232 that are connected in parallel via corresponding contact electrodes. The ferroelectric memory cell 271 and the ferroelectric memory cell 272 are symmetrically formed on the boundary surface therebetween. The ferroelectric memory according to this embodiment is formed by a repeated pattern of the ferroelectric memory cell 271 and a ferroelectric memory cell 272. Besides, the ferroelectric memory cell 271 and the ferroelectric memory cell 272 are connected via the n-type diffusion layer 262.

A ferroelectric memory cell 273 adjacent to the ferroelectric memory cell 272 includes the transistor 223 and the ferroelectric capacitor 233. The transistor 223 and the ferroelectric capacitor 233 are connected in parallel via corresponding contact electrodes. In addition, the ferroelectric memory cell 273 is connected via a metal wiring layer 259 to the ferroelectric memory cell 272.

A ferroelectric memory cell 274 adjacent to the ferroelectric memory cell 273 includes the transistor 224 and the ferroelectric capacitor 234. The transistor 224 and the ferroelectric capacitor 234 are connected in parallel via corresponding contact electrodes. In addition, the ferroelectric memory cell 274 is connected via an n-type diffusion layer 263 to the ferroelectric memory cell 273.

A ferroelectric memory cell 275 adjacent to the ferroelectric memory cell 274 includes the transistor 225 and the ferroelectric capacitor 235. The transistor 225 and the ferroelectric capacitor 235 are connected in parallel via corresponding contact electrodes. In addition, the ferroelectric memory cell 275 is connected via a metal wiring layer 260 to the ferroelectric memory cell 274.

As can be seen from the above, five ferroelectric memory cells 271, 272, 273, 274, 275 are connected in series to configure the block 210. In one end of the block 210, i.e., a region 276 adjacent to the ferroelectric memory cell 275, n-type diffusion regions 264 and 265 together with a gate electrode 266 form the selection transistor 211. The n-type diffusion region 265 is connected via a contact electrode 267 to a metal wiring layer 268. Further, the metal wiring layer 268 is connected to the bit line BL1.

In the block 210, six transistors including five transistors 221, 222, 223, 224, 225, which configure five ferroelectric memory cells 271, 272, 273, 274, 275, respectively, and the selection transistor 211, are formed on the silicon substrate. Therefore, the ferroelectric memory may be formed without disturbing any above-mentioned periodic pattern of the two transistors. As a result, uniform properties may be obtained for each ferroelectric memory cell. In particular, improved uniformity of property may be obtained among the ferroelectric memory cell 275 adjacent to the selection transistor 211 and the other ferroelectric memory cells 271, 272, 273, 274.

In addition, as a dummy ferroelectric capacitor 236 provided in this embodiment, even more uniform properties may be obtained for each ferroelectric memory cell. That is, the dummy ferroelectric capacitor 236 is formed at a position within the region 276. The region 276 is for forming the selection transistor 211, and is adjacent to the ferroelectric memory cell 275. The position where the dummy ferroelectric capacitor 236 is formed corresponds to a position where the ferroelectric capacitor 235 is formed in the adjacent ferroelectric memory cell 275. As a result, further improved symmetry features may be obtained between the ferroelectric memory cell 275 and the region 276 where the selection transistor 211 is formed. Therefore, even more uniform properties may be obtained among the ferroelectric memory cell 275 and the other ferroelectric memory cells 271, 272, 273, 274. Besides, the transistor 212 illustrated in FIG. 9 is no longer formed here, since it is shortened by the n-type diffusion region 264 illustrated in FIG. 10. In addition, the dummy ferroelectric capacitor 236 is provided for ensuring uniformity and periodicity, and so it is not connected to the n-type diffusion region 264 or the metal wiring layer 268.

Figure 11:
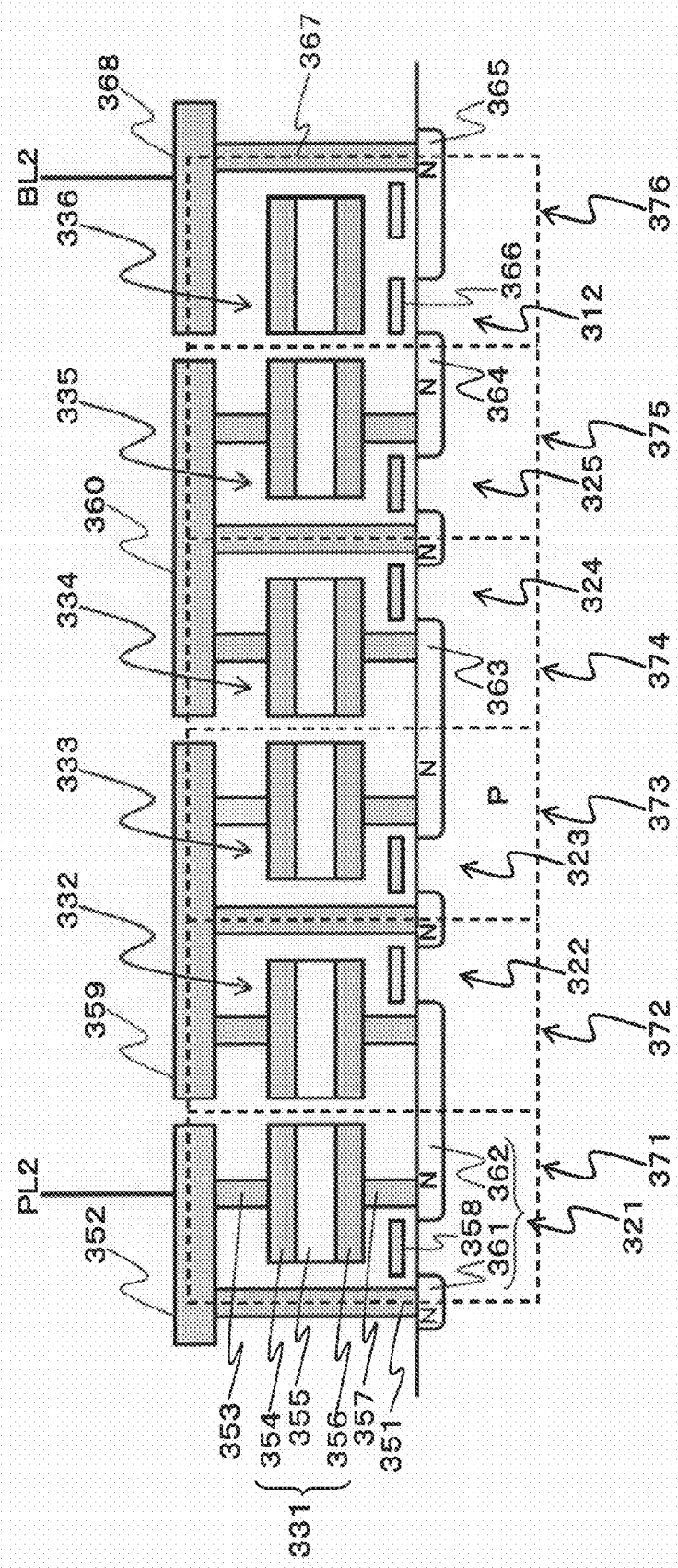
FIG. 11 is a structural cross-section diagram (2) according to the third embodiment.

FIG. 11 is a structural cross-section diagram illustrating circuits in the block 310 of FIG. 9 formed on the silicon substrate according to the third embodiment.

Specifically, the ferroelectric memory according to this embodiment includes a plurality of ferroelectric memory cells and a selection transistor. Each of the plurality of ferroelectric memory cells has a respective electrode and a respective ferroelectric capacitor that are formed on a p-type silicon substrate in which an n-type impurity is diffused. That is, a contact electrode 351 is formed on an n-type diffusion region 361 on a surface of the silicon substrate and connected to a metal wiring layer 352. The metal wiring layer 352 is connected to the plate line PL2 as well as to an upper electrode 354 of the ferroelectric capacitor 331 via a contact electrode 353. The ferroelectric capacitor 331 is formed by lamination of the upper electrode 354, a ferroelectric layer 355, and a lower electrode 356. The lower electrode 356 is connected via a contact electrode 357 to an n-type diffusion region 362 on the silicon substrate. A gate electrode 358 is formed immediately above the region between the n-type diffusion region 361 and the n-type diffusion region 362. Since the silicon substrate is of p-type, the n-type diffusion regions 361 and 362 together with the gate electrode 358 form the transistor 321. A ferroelectric memory cell 371, which includes a region surrounded by dashed lines, is formed by the transistor 321 and the ferroelectric capacitor 331 connected both ends thereof. The other ferroelectric memory cells are arranged in a similar configuration. The adjacent ferroelectric memory cells are symmetrically formed on a corresponding boundary surface. Specifically, a ferroelectric memory cell 372 adjacent to the ferroelectric memory cell 371 includes the transistor 322 and the ferroelectric capacitor 332 that are connected in parallel via corresponding contact electrodes. The ferroelectric memory cell 371 and the ferroelectric memory cell 372 are symmetrically formed on the boundary surface therebetween. The ferroelectric memory according to this embodiment is formed by a repeated pattern of the ferroelectric memory cell 371 and the ferroelectric memory cell 372. Besides, the ferroelectric memory cell 371 and the ferroelectric memory cell 372 are connected via the n-type diffusion layer 362.

A ferroelectric memory cell 373 adjacent to the ferroelectric memory cell 372 includes the transistor 323 and the ferroelectric capacitor 333. The transistor 323 and the ferroelectric capacitor 333 are connected in parallel via corresponding contact electrodes. In addition, the ferroelectric memory cell 373 is connected via a metal wiring layer 359 to the ferroelectric memory cell 372.

A ferroelectric memory cell 374 adjacent to the ferroelectric memory cell 373 includes the transistor 324 and the ferroelectric capacitor 334. The transistor 324 and the ferroelectric capacitor 334 are connected in parallel via corresponding contact electrodes. In addition, the ferroelectric memory cell 374 is connected via an n-type diffusion layer 363 to the ferroelectric memory cell 373.

A ferroelectric memory cell 375 adjacent to the ferroelectric memory cell 374 includes the transistor 325 and the ferroelectric capacitor 335. The transistor 325 and the ferroelectric capacitor 335 are connected in parallel via corresponding contact electrodes. In addition, the ferroelectric memory cell 375 is connected via a metal wiring layer 360 to the ferroelectric memory cell 374.

As can be seen from the above, five ferroelectric memory cells 371, 372, 373, 374, 375 are connected in series to configure the block 310. In one end of the block 310, i.e., a region 376 adjacent to the ferroelectric memory cell 375, n-type diffusion regions 364 and 365 together with a gate electrode 366 form the selection transistor 312. The n-type diffusion region 365 is connected via a contact electrode 367 to a metal wiring layer 368. Further, the metal wiring layer 368 is connected to the bit line BL2.

In the block 310, six transistors including five transistors 321, 322, 323, 324, 325, which configure five ferroelectric memory cells 371, 372, 373, 374, 375, respectively, and the selection transistor 312, are formed on the silicon substrate. Therefore, the ferroelectric memory may be formed without disturbing any above-mentioned periodic pattern of the two transistors. As a result, uniform properties may be obtained for each ferroelectric memory cell. In particular, improved uniformity of property may be obtained among the ferroelectric memory cell 375 adjacent to the selection transistor 312 and the other ferroelectric memory cells 371, 372, 373, 374.

In addition, as a dummy ferroelectric capacitor 336 provided in this embodiment, even more uniform properties may be obtained for each ferroelectric memory cell. That is, the dummy ferroelectric capacitor 336 is formed at a position within the region 376. The region 376 is for forming the selection transistor 312, and is adjacent to the ferroelectric memory cell 375. The position where the dummy ferroelectric capacitor 336 is formed corresponds to a position where the ferroelectric capacitor 335 is formed in the adjacent ferroelectric memory cell 375. As a result, further improved symmetry features may be obtained between the ferroelectric memory cell 375 and the region 376 where the selection transistor 312 is formed. Therefore, even more uniform properties may be obtained among the ferroelectric memory cell 375 and the other ferroelectric memory cells 371, 372, 373, 374. Besides, the transistor 311 illustrated in FIG. 9 is no longer formed here, since it is shortened by the n-type diffusion region 365 illustrated in FIG. 11. In addition, the dummy ferroelectric capacitor 336 is provided for ensuring uniformity and periodicity, and so it is not connected to the n-type diffusion region 365 or the metal wiring layer 368.

Fourth Embodiment

A fourth embodiment of the present invention will now be described below.

Figure 12:
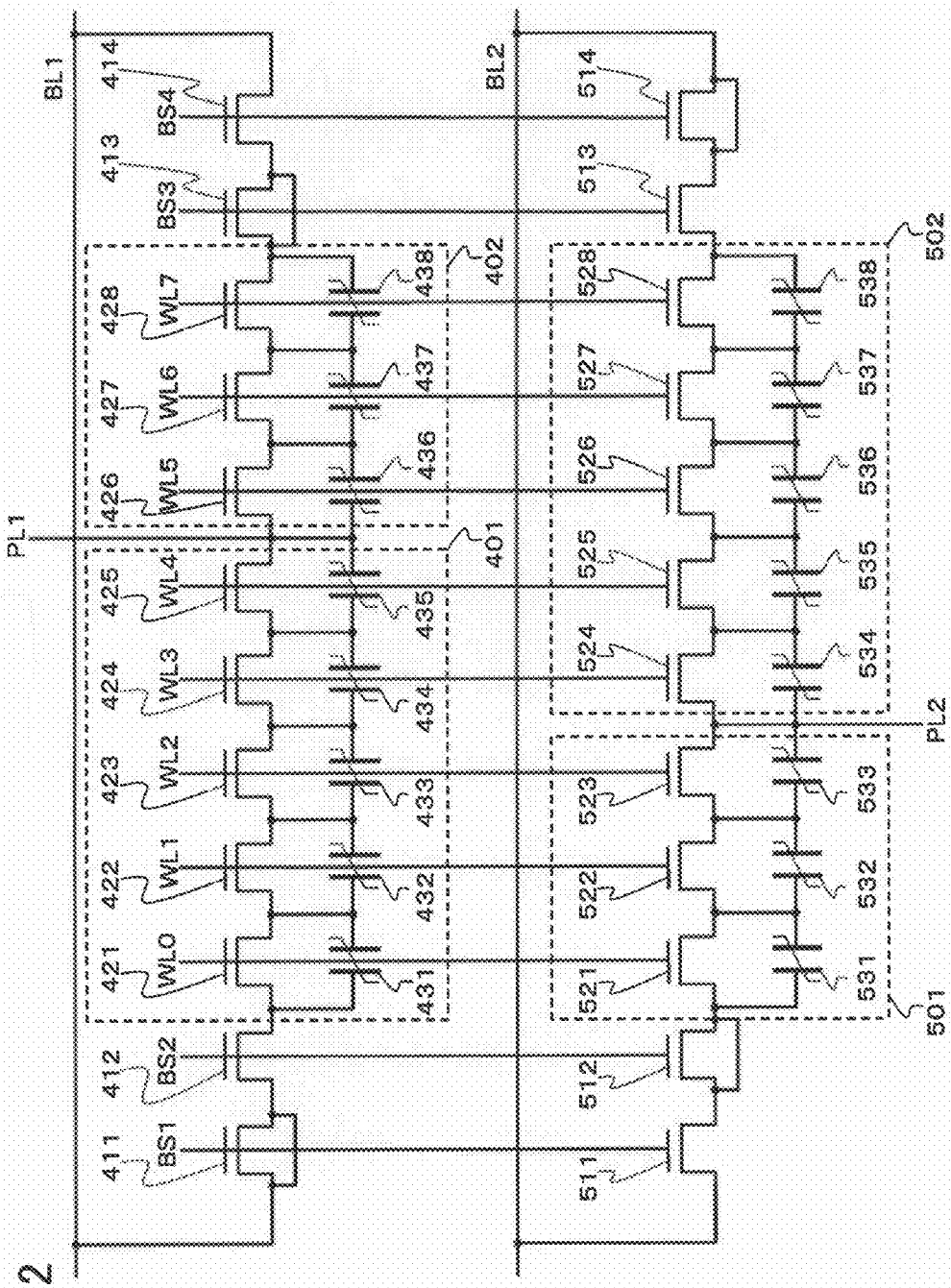
FIG. 12 is a circuit diagram according to a fourth embodiment.

FIG. 12 is a circuit diagram illustrating a configuration of the ferroelectric memory block according to the fourth embodiment. This embodiment comprises the following two blocks; one ferroelectric memory block having first and second blocks 401 and 402 connected in series, each of which has odd numbers of ferroelectric memory cells connected in series, respectively; and the other ferroelectric memory block having first and second blocks 501 and 502 connected in series, each of which has odd numbers of ferroelectric memory cells connected in series, respectively. Therefore, one block includes even numbers of ferroelectric memory cells.

In the ferroelectric memory block where the first block 401 and the second block 402 are connected in series, the first block 401 is formed by the following ferroelectric memory cells that are connected in series: a ferroelectric memory cell having the transistor 421 connected to both ends of a ferroelectric capacitor 431; a ferroelectric memory cell having the transistor 422 connected to both ends of a ferroelectric capacitor 432; a ferroelectric memory cell having the transistor 423 connected to both ends of a ferroelectric capacitor 433; a ferroelectric memory cell having the transistor 424 connected to both ends of a ferroelectric capacitor 434; and a ferroelectric memory cell having the transistor 425 connected to both ends of a ferroelectric capacitor 435. The gate of the transistor 421 is connected to a word line WL0, the gate of the transistor 422 connected to a word line WL1, the gate of the transistor 423 connected to a word line WL2, the gate of the transistor 424 connected to a word line WL3, and the gate of the transistor 425 connected to a word line WL4, respectively.

In addition, the second block 402 is formed by the following ferroelectric memory cells that are connected in series: a ferroelectric memory cell having a transistor 426 connected to both ends of a ferroelectric capacitor 436; a ferroelectric memory cell having a transistor 427 connected to both ends of a ferroelectric capacitor 437; and a ferroelectric memory cell having a transistor 428 connected to both ends of a ferroelectric capacitor 438. The gate of the transistor 426 is connected to a word line WL5, the gate of the transistor 427 connected to a word line WL6, and the gate of the transistor 428 connected to a word line WL7, respectively.

One end of the first block 401, i.e., one of the ferroelectric memory cells that includes the ferroelectric capacitor 435 and the transistor 425 is connected in series to one end of the second block 402, i.e., one of the ferroelectric memory cells that includes the ferroelectric capacitor 436 and the transistor 426. The first and second blocks 401 and 402 entirely form one ferroelectric memory block.

The first block 401 includes five ferroelectric memory cells, while the second block 402 includes three ferroelectric memory cells. Therefore, the number of ferroelectric memory cells in the one ferroelectric memory block including the first and second blocks 401 and 402 is eight (even number), which is a power-of-two natural number. The one ferroelectric memory block includes, the power-of-two natural numbers of, eight (even numbers of), ferroelectric memory cells. In addition, a plate line PL1 is formed so as to extend from the connection between one end of the first block 401 and one end of the second block 402.

The other end of the first block 401, i.e., one of the ferroelectric memory cells that includes the ferroelectric capacitor 431 and a transistor 421 is connected to a selection transistor 412, which is in turn connected via a shortened transistor 411 to a bit line BL1. In addition, the other end of the second block 402, i.e., one of the ferroelectric memory cells that includes the ferroelectric capacitor 438 and the transistor 428 is connected via a shortened transistor 413 to a selection transistor 414, which is in turn connected to the bit line BL1. Besides, the gate of the selection transistor 412 is connected to a block selection line BS2, while the gate of the selection transistor 414 is connected to a block selection line BS4.

In addition, in the ferroelectric memory block where the first block 501 and the second block 502 are connected in series, the first block 501 is formed by the following ferroelectric memory cells that are connected in series: a ferroelectric memory cell having a transistor 521 connected to both ends of a ferroelectric capacitor 531; a ferroelectric memory cell having a transistor 522 connected to both ends of a ferroelectric capacitor 532; and a ferroelectric memory cell having a transistor 523 connected to both ends of a ferroelectric capacitor 533. The gate of the transistor 521 is connected to a word line WL0, the gate of the transistor 522 connected to a word line WL1, and the gate of the transistor 523 connected to a word line WL2, respectively.

In addition, the second block 502 is formed by the following ferroelectric memory cells that are connected in series: a ferroelectric memory cell having a transistor 524 connected to both ends of a ferroelectric capacitor 534; a ferroelectric memory cell having a transistor 525 connected to both ends of a ferroelectric capacitor 535; a ferroelectric memory cell having a transistor 526 connected to both ends of a ferroelectric capacitor 536; a ferroelectric memory cell having a transistor 527 connected to both ends of a ferroelectric capacitor 537; and a ferroelectric memory cell having a transistor 528 connected to both ends of a ferroelectric capacitor 538. The gate of the transistor 524 is connected to a word line WL3, the gate of the transistor 525 connected to a word line WL4, the gate of the transistor 526 connected to a word line WL5, the gate of the transistor 527 connected to a word line WL6, and the gate of the transistor 528 connected to a word line WL7, respectively.

One end of the first block 501, i.e., one of the ferroelectric memory cells that includes the ferroelectric capacitor 533 and the transistor 523 is connected in series to one end of the second block 502, i.e., one of the ferroelectric memory cells that includes the ferroelectric capacitor 534 and the transistor 524. The first and second blocks 501 and 502 entirely form one ferroelectric memory block.

The first block 501 includes three ferroelectric memory cells, while the second block 502 includes five ferroelectric memory cells. Therefore, the number of ferroelectric memory cells in the one ferroelectric memory block including the first and second blocks 501 and 502 is eight (even number), which is a power-of-two natural number. The one ferroelectric memory block includes, the power-of-two natural numbers of, eight (even numbers of), ferroelectric memory cells. In addition, a plate line PL2 is formed so as to extend from the connection between one end of the first block 501 and one end of the second block 502.

The other end of the first block 501, i.e., one of the ferroelectric memory cells that includes the ferroelectric capacitor 531 and the transistor 521 is connected via a shortened transistor 512 to a selection transistor 511, which is in turn connected to a bit line BL2. In addition, the other end of the second block 502, i.e., one of the ferroelectric memory cells that includes the ferroelectric capacitor 538 and the transistor 528 is connected to a selection transistor 513, which is in turn connected via a shortened transistor 514 to the bit line BL2. Besides, the gate of the selection transistor 511 is connected to a block selection line BS1, while the gate of the selection transistor 513 is connected to a block selection line BS3.

Figure 13:
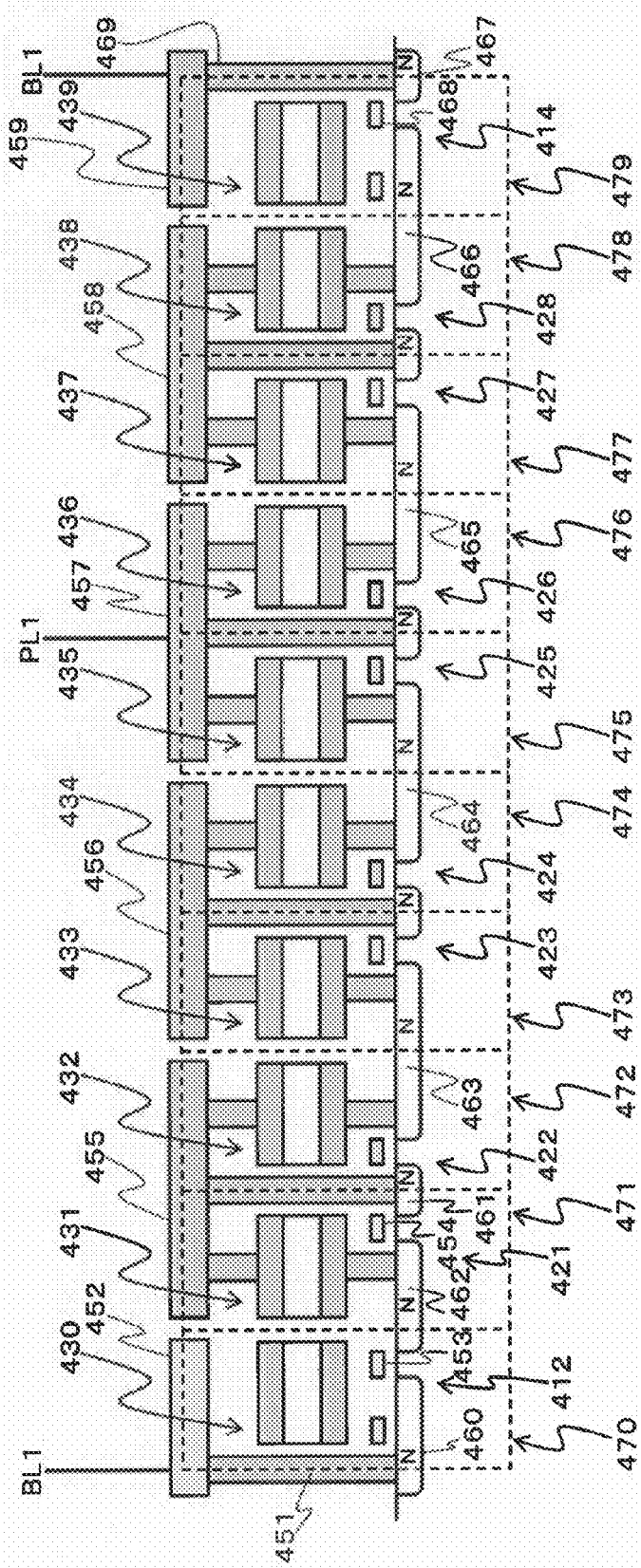
FIG. 13 is a structural cross-section diagram (1) according to the fourth embodiment.

FIG. 13 is a structural cross-section diagram illustrating the blocks, including the first and second blocks 401 and 402 of FIG. 12, formed on the silicon substrate.

Specifically, the ferroelectric memory according to this embodiment includes a plurality of ferroelectric memory cells and a selection transistor. Each of the plurality of ferroelectric memory cells has a respective electrode and a respective ferroelectric capacitor that are formed on a p-type silicon substrate in which an n-type impurity is diffused. Specifically, a contact electrode 451 is formed on an n-type diffusion region 460 on a surface of the silicon substrate and connected via a metal wiring layer 452 to the bit line BL1.

A gate electrode 453 is formed immediately above the region between the n-type diffusion region 460 and an n-type diffusion region 462 on the silicon substrate. Since the silicon substrate is of p-type, the n-type diffusion regions 460 and 462 together with the gate electrode 453 form the selection transistor 412. A region 470 (surrounded by dashed lines) where the selection transistor 412 is formed is substantially as large as a region that configures one ferroelectric memory cell described hereinafter.

A ferroelectric memory cell 471 surrounded by dashed lines is formed adjacent to the region 470 where the selection transistor 412 is formed. The ferroelectric memory cell 471 includes: the transistor 421 including n-type diffusion layers 461 and 462 and a gate electrode 454; and the ferroelectric capacitor 431 connected in parallel to both ends of the transistor 421. The ferroelectric memory cell 471 is connected via the n-type diffusion layer 462 to the selection transistor 412. Besides, each ferroelectric memory cell has a similar configuration to the first embodiment.

A ferroelectric memory cell 472 adjacent to the ferroelectric memory cell 471 includes the transistor 422 and the ferroelectric capacitor 432. The transistor 422 and the ferroelectric capacitor 432 are connected in parallel via corresponding contact electrodes. In addition, the ferroelectric memory cell 471 and the ferroelectric memory cell 472 are connected via a metal wiring layer 455.

A ferroelectric memory cell 473 adjacent to the ferroelectric memory cell 472 includes the transistor 423 and the ferroelectric capacitor 433. The transistor 423 and the ferroelectric capacitor 433 are connected in parallel via corresponding contact electrodes. In addition, the ferroelectric memory cell 472 and the ferroelectric memory cell 473 are connected via an n-type diffusion region 463.

The ferroelectric memory according to this embodiment is formed by a repeated pattern of the ferroelectric memory cell 471 and the ferroelectric memory cell 472.

A ferroelectric memory cell 474 adjacent to the ferroelectric memory cell 473 includes the transistor 424 and the ferroelectric capacitor 434. The transistor 424 and the ferroelectric capacitor 434 are connected in parallel via corresponding contact electrodes. In addition, the ferroelectric memory cell 473 and the ferroelectric memory cell 474 are connected via a metal wiring layer 456.

A ferroelectric memory cell 475 adjacent to the ferroelectric memory cell 474 includes the transistor 425 and the ferroelectric capacitor 435. The transistor 425 and the ferroelectric capacitor 435 are connected in parallel via corresponding contact electrodes. In addition, the ferroelectric memory cell 474 and the ferroelectric memory cell 475 are connected via an n-type diffusion region 464.

Besides, the ferroelectric memory cells 471, 472, 473, 474, 475 form the first block 401. The ferroelectric capacitor 435 of the ferroelectric memory cell 475 is connected via corresponding contact electrodes to a metal wiring layer 457. The metal wiring layer 457 is connected to the plate line PL1.

A ferroelectric memory cell 476 adjacent to the ferroelectric memory cell 475 includes the transistor 426 and the ferroelectric capacitor 436. The transistor 426 and the ferroelectric capacitor 436 are connected in parallel via corresponding contact electrodes. In addition, the ferroelectric memory cell 475 and the ferroelectric memory cell 476 are connected via the metal wiring layer 457.

A ferroelectric memory cell 477 adjacent to the ferroelectric memory cell 476 includes the transistor 427 and the ferroelectric capacitor 437. The transistor 427 and the ferroelectric capacitor 437 are connected in parallel via corresponding contact electrodes. In addition, the ferroelectric memory cell 476 and the ferroelectric memory cell 477 are connected via an n-type diffusion region 465.

A ferroelectric memory cell 478 adjacent to the ferroelectric memory cell 477 includes the transistor 428 and the ferroelectric capacitor 438. The transistor 428 and the ferroelectric capacitor 438 are connected in parallel via corresponding contact electrodes. In addition, the ferroelectric memory cell 477 and the ferroelectric memory cell 478 are connected via a metal wiring layer 458.

Besides, the ferroelectric memory cells 476, 477, 478 entirely form the second block 402.

The selection transistor 414 is formed in a region 479 surrounded by dashed lines adjacent to the ferroelectric memory cell 478. Specifically, a gate electrode 468 is formed immediately above the region between an n-type diffusion region 466 and an n-type diffusion region 467 on the silicon substrate. Since the silicon substrate is a p-type substrate, the n-type diffusion regions 466 and 467 together with the gate electrode 468 form the selection transistor 414. A region 479 (surrounded by dashed lines) where the selection transistor 414 is formed is substantially as large as the region that configures the one ferroelectric memory cell mentioned above.

A contact electrode 469 is formed on the n-type diffusion region 467 and connected to a metal wiring layer 459. The metal wiring layer 459 is connected to the bit line BL1.

Since one block is configured by the first block 401 that includes odd numbers of, five, ferroelectric memory cells and the second block 402 that includes odd numbers of, three, ferroelectric memory cells, even numbers of, eight, ferroelectric memory cells and two selection transistors is formed accordingly. These two transistors 412 and 414 have the same structures for their patterns as those of the ferroelectric memory cells, except that, unlike the ferroelectric memory cells, no ferroelectric capacitor shall be connected thereto. Therefore, the ferroelectric memory may be formed without disturbing any periodic pattern of the ferroelectric memory cells.

Specifically, a dummy ferroelectric capacitor 430 is formed at a position within the region 470. The region 470 is for forming the selection transistor 412, and is adjacent to the ferroelectric memory cell 471. The position where the dummy ferroelectric capacitor 430 is formed corresponds to a position where the ferroelectric capacitor 431 is formed in the adjacent ferroelectric memory cell 471. And together with this, a dummy ferroelectric capacitor 439 is formed at a position within the region 479. The region 479 is for forming the selection transistor 414, and is adjacent to the ferroelectric memory cell 478. The position where the dummy ferroelectric capacitor 439 is formed corresponds to a position where the ferroelectric capacitor 438 is formed in the adjacent ferroelectric memory cell 478. As a result, further improved symmetry features may be obtained between the ferroelectric memory cell 471 and the region 470 where the selection transistor 412 is formed, as well as between the ferroelectric memory cell 478 and the region 479 where the selection transistor 414 is formed. Therefore, even more uniform properties may be obtained among the ferroelectric memory cells 471 and 478 and the other ferroelectric memory cells 472, 473, 474, 475, 476, 477. Besides, the transistor 411 illustrated in FIG. 12 is no longer formed here, since it is shortened by the n-type diffusion region 460 illustrated in FIG. 13. In addition, the transistor 413 illustrated in FIG. 12 is also no longer formed here, since it is shortened by the n-type diffusion region 466 illustrated in FIG. 13.

Figure 14:
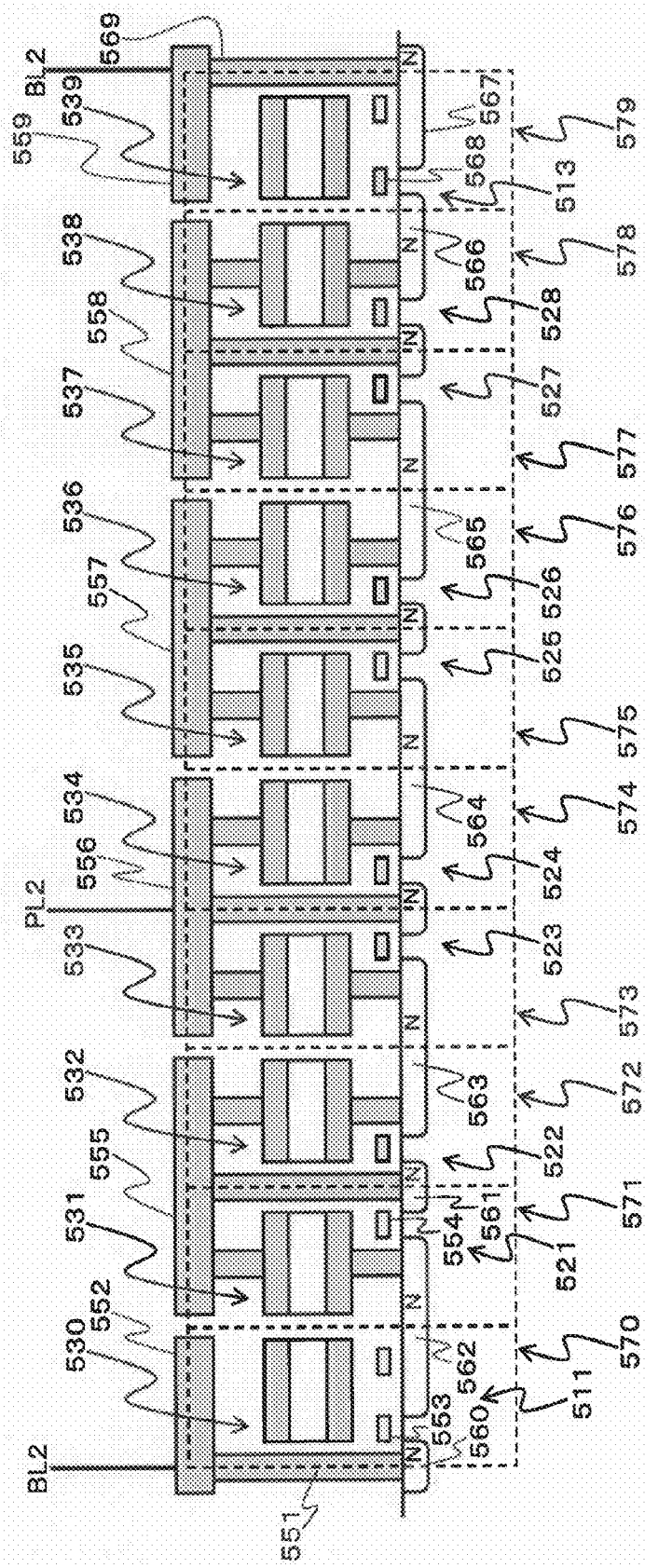
FIG. 14 is a structural cross-section diagram (2) according to the fourth embodiment.

FIG. 14 is a structural cross-section diagram illustrating the blocks, including the first and second blocks 501 and 502 of FIG. 12, formed on the silicon substrate.

Specifically, the ferroelectric memory according to this embodiment includes a plurality of ferroelectric memory cells and a selection transistor. Each of the plurality of ferroelectric memory cells has a respective electrode and a respective ferroelectric capacitor that are formed on a p-type silicon substrate in which an n-type impurity is diffused. Specifically, a contact electrode 551 is formed on an n-type diffusion region 560 on a surface of the silicon substrate and connected via a metal wiring layer 552 to the bit line BL2.

A gate electrode 553 is formed immediately above the region between the n-type diffusion region 560 and an n-type diffusion region 562 on the silicon substrate. Since the silicon substrate is of p-type, the n-type diffusion regions 560 and 562 together with the gate electrode 553 form the selection transistor 511. A region 570 (surrounded by dashed lines) where the selection transistor 511 is formed is substantially as large as a region that configures one ferroelectric memory cell described hereinafter.

A ferroelectric memory cell 571 surrounded by dashed lines is formed adjacent to the region 570 where the selection transistor 511 is formed. The ferroelectric memory cell 571 includes: the transistor 521 including n-type diffusion layers 561 and 562 and a gate electrode 554; and the ferroelectric capacitor 531 connected in parallel to both ends of the transistor 521. The ferroelectric memory cell 571 is connected via the n-type diffusion layer 562 to the selection transistor 511. Besides, each ferroelectric memory cell has a similar configuration to the first embodiment.

A ferroelectric memory cell 572 adjacent to the ferroelectric memory cell 571 includes the transistor 522 and the ferroelectric capacitor 532. The transistor 522 and the ferroelectric capacitor 532 are connected in parallel via corresponding contact electrodes. In addition, the ferroelectric memory cell 571 and the ferroelectric memory cell 572 are connected via a metal wiring layer 555.

A ferroelectric memory cell 573 adjacent to the ferroelectric memory cell 572 includes the transistor 523 and the ferroelectric capacitor 533. The transistor 523 and the ferroelectric capacitor 533 are connected in parallel via corresponding contact electrodes. In addition, the ferroelectric memory cell 572 and the ferroelectric memory cell 573 are connected via an n-type diffusion region 563.

The ferroelectric memory according to this embodiment is formed by a repeated pattern of the ferroelectric memory cell 571 and the ferroelectric memory cell 572.

Besides, the ferroelectric memory cells 571, 572, 573 entirely form the first block 501. The ferroelectric capacitor 533 of the ferroelectric memory cell 573 is connected via corresponding contact electrodes to a metal wiring layer 556. The metal wiring layer 556 is connected to the plate line PL2.

A ferroelectric memory cell 574 adjacent to the ferroelectric memory cell 573 includes the transistor 524 and the ferroelectric capacitor 534. The transistor 524 and the ferroelectric capacitor 534 are connected in parallel via corresponding contact electrodes. In addition, the ferroelectric memory cell 573 and the ferroelectric memory cell 574 are connected via the metal wiring layer 556.

A ferroelectric memory cell 575 adjacent to the ferroelectric memory cell 574 includes the transistor 525 and the ferroelectric capacitor 535. The transistor 525 and the ferroelectric capacitor 535 are connected in parallel via corresponding contact electrodes. In addition, the ferroelectric memory cell 574 and the ferroelectric memory cell 575 are connected via an n-type diffusion region 564.

A ferroelectric memory cell 576 adjacent to the ferroelectric memory cell 575 includes the transistor 526 and the ferroelectric capacitor 536. The transistor 526 and the ferroelectric capacitor 536 are connected in parallel via corresponding contact electrodes. In addition, the ferroelectric memory cell 575 and the ferroelectric memory cell 576 are connected via a metal wiring layer 557.

A ferroelectric memory cell 577 adjacent to the ferroelectric memory cell 576 includes the transistor 527 and the ferroelectric capacitor 537. The transistor 527 and the ferroelectric capacitor 537 are connected in parallel via corresponding contact electrodes. In addition, the ferroelectric memory cell 576 and the ferroelectric memory cell 577 are connected via an n-type diffusion region 565.

A ferroelectric memory cell 578 adjacent to the ferroelectric memory cell 577 includes the transistor 528 and the ferroelectric capacitor 538. The transistor 528 and the ferroelectric capacitor 538 are connected in parallel via corresponding contact electrodes. In addition, the ferroelectric memory cell 577 and the ferroelectric memory cell 578 are connected via a metal wiring layer 558.

Besides, the ferroelectric memory cells 574, 575, 576, 577, 578 entirely form the second block 502.

The selection transistor 513 is formed in a region 579 surrounded by dashed lines adjacent to the ferroelectric memory cell 578. Specifically, a gate electrode 568 is formed immediately above the region between an n-type diffusion region 566 and an n-type diffusion region 567 on the silicon substrate. Since the silicon substrate is a p-type substrate, the n-type diffusion regions 566 and 567 together with the gate electrode 568 form the selection transistor 513. A region 579 (surrounded by dashed lines) where the selection transistor 513 is formed is substantially as large as the region that configures the one ferroelectric memory cell mentioned above.

A contact electrode 569 is formed on the n-type diffusion region 567 and connected to a metal wiring layer 559. The metal wiring layer 559 is connected to the bit line BL2.

Since one block is configured by the first block 501 that includes odd numbers of, three, ferroelectric memory cells and the second block 502 that includes odd numbers of, five, ferroelectric memory cells, even numbers of, eight, ferroelectric memory cells and two selection transistors are formed accordingly. These two transistors 511 and 513 have the same structures for their patterns as those of the ferroelectric memory cells, except that, unlike the ferroelectric memory cells, no ferroelectric capacitor shall be connected thereto. Therefore, the ferroelectric memory may be formed without disturbing any periodic pattern of the ferroelectric memory cells.

Specifically, a dummy ferroelectric capacitor 530 is formed at a position within the region 570. The region 570 is for forming the selection transistor 511, and is adjacent to the ferroelectric memory cell 571. The position where the dummy ferroelectric capacitor 530 is formed corresponds to a position where the ferroelectric capacitor 531 is formed in the adjacent ferroelectric memory cell 571. And together with this, a dummy ferroelectric capacitor 539 is formed at a position within the region 579. The region 579 is for forming the selection transistor 513, and is adjacent to the ferroelectric memory cell 578. The position where the dummy ferroelectric capacitor 539 is formed corresponds to a position where the ferroelectric capacitor 538 is formed in the adjacent ferroelectric memory cell 578. As a result, further improved symmetry features may be obtained between the ferroelectric memory cell 571 and the region 570 where the selection transistor 511 is formed, as well as between the ferroelectric memory cell 578 and the region 579 where the selection transistor 513 is formed. Therefore, even more uniform properties may be obtained among the ferroelectric memory cells 571 and 578 and the other ferroelectric memory cells 572, 573, 574, 575, 576, 577. Besides, the transistor 512 illustrated in FIG. 12 is no longer formed here, since it is shortened by the n-type diffusion region 562 illustrated in FIG. 14. In addition, the transistor 514 illustrated in FIG. 12 is no longer formed here, since it is shortened by the n-type diffusion region 567 illustrated in FIG. 14.

While the ferroelectric semiconductor storage device has been described in detail according to embodiments of the present invention, the present invention is not limited to these embodiments and may take other forms than described and illustrated herein.

What is claimed is:

1. A ferroelectric semiconductor storage device comprising:
   a first block having odd numbers of ferroelectric memory cells connected in series, each of the odd numbers of ferroelectric memory cells including a first ferroelectric capacitor and a first transistor, a first drain/source terminal of the transistor being connected to one terminal of the first ferroelectric capacitor, and a second drain/source terminal of the first transistor being connected to the other terminal of the first ferroelectric capacitor;
   a second block having odd numbers of ferroelectric memory cells connected in series, each of the odd numbers of ferroelectric memory cells including a second ferroelectric capacitor and a second transistor, a first drain/source terminal of the second transistor being connected to one terminal of the second ferroelectric capacitor, and a second drain/source terminal of the second transistor being connected to the other terminal of the second ferroelectric capacitor;
   a plate line extending from a connection between one end of the first block and one end of the second block, each of the one ends connected to each other;
   a word line connected to each of the first and second transistors;
   a first selection transistor connected to the other end of the first block;
   a second selection transistor connected to the other end of the second block; and
   a bit line connected to each of the first selection transistor and the second selection transistor,
   the first block and the second block together form one block, and
   the number of the ferroelectric memory cells in the one block being power-of-two natural number.

2. The ferroelectric semiconductor storage device according to claim 1, wherein
   a dummy ferroelectric capacitor is formed at a position within a region where the first selection transistor is formed, the position corresponding to a position where a ferroelectric capacitor is formed in adjacent one of the ferroelectric memory cells; and
   a dummy ferroelectric capacitor is formed at a position within a region where the second selection transistor is formed, the position corresponding to a position where a ferroelectric capacitor is formed in adjacent one of the ferroelectric memory cells.

3. The ferroelectric semiconductor storage device according to claim 1, wherein the first and second transistors, the first selection transistor, and the second selection transistor are of planer type, respectively.

4. The ferroelectric semiconductor storage device according to claim 1, wherein each region where the first selection transistor or the second selection transistor is formed is substantially as large as a region where the ferroelectric memory cell is formed.

* * * * *